(12) United States Patent
Kadijk (10) Patent No.: US 10,428,817 B2
(45) Date of Patent: Oct. 1, 2019

(54) COOLING ARRANGEMENT FOR COOLING AN APPARATUS

(71) Applicant: SIGNIFY HOLDING B.V., Eindhoven (NL)

(72) Inventor: Simon Eme Kadijk, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/080,831

(22) PCT Filed: Mar. 13, 2017

(86) PCT No.: PCT/EP2017/055800
§ 371 (c)(1),
(2) Date: Aug. 29, 2018

(87) PCT Pub. No.: WO2017/157832
PCT Pub. Date: Sep. 21, 2017

(65) Prior Publication Data
US 2019/0055943 A1     Feb. 21, 2019

(30) Foreign Application Priority Data

Mar. 18, 2016   (EP) .................................. 16161203

(51) Int. Cl.
*F21V 29/00*       (2015.01)
*F04C 18/02*       (2006.01)
(Continued)

(52) U.S. Cl.
CPC ...... *F04C 18/0215* (2013.01); *F04C 18/0261* (2013.01); *F21V 29/56* (2015.01);
(Continued)

(58) Field of Classification Search
None
See application file for complete search history.

(56) References Cited

U.S. PATENT DOCUMENTS 4,300,874 A  *  11/1981  Georgiev ................. F01C 1/22
                                                   418/150
5,273,106 A     12/1993  Drake
(Continued)

FOREIGN PATENT DOCUMENTS

| DE | 202010006688 U1 | 10/2010 |
|----|-----------------|---------|
| GB | 2416316 A       | 1/2006  |
| WO | WO2013185623 A1 | 12/2013 |

*Primary Examiner* — Vip Patel (57) ABSTRACT

A cooling arrangement (1) for cooling of an apparatus (10) which in use may generate heat is disclosed. The cooling arrangement (1) comprises a first member (2), which comprises a first base (4) and a first spiral wrap (5) extending from the first base (4), and a second member (3), which comprises a second base (6) and a second spiral wrap (7) extending from the second base (6). The first spiral wrap (5) and the second spiral wrap (7) are interleaved. The first member (2) is configured to at least thermally couple the apparatus (10) thereto. At least one of the first member (2) and the second member (3) can be moved so as to result in an orbiting motion of one of the first spiral wrap (5) and the second spiral wrap (7) relatively to the other one of the first spiral wrap (5) and the second spiral wrap (7) such that a volume of fluid in at least one space between the first spiral wrap (5) and the second spiral wrap (7) progressively moves during the orbiting motion. Thereby, a flow of fluid between the first spiral wrap (5) and the second spiral wrap (7) is generated which cools the first member (2) by means of dissipation of heat generated by the apparatus (10) by way of transfer of heat from the first member (2) to the flow of fluid between the first spiral wrap (5) and the second spiral wrap (7).

14 Claims, 2 Drawing Sheets

(51) Int. Cl.
  *F21V 29/56* (2015.01)
  *F21V 29/60* (2015.01)
  *H01L 23/36* (2006.01)
  *H01L 23/473* (2006.01)
  *F21V 29/58* (2015.01)
  *F21V 29/78* (2015.01)
  *F21Y 115/10* (2016.01)

(52) U.S. Cl.
  CPC .............. *F21V 29/59* (2015.01); *F21V 29/60* (2015.01); *F21V 29/78* (2015.01); *H01L 23/36* (2013.01); *H01L 23/473* (2013.01); *F21Y 2115/10* (2016.08)

(56) References Cited

U.S. PATENT DOCUMENTS

| | | | |
|---|---|---|---|
| 5,547,353 A * | 8/1996 | Yamaguchi | F04C 18/0215 418/55.2 |
| 7,972,125 B2 | 7/2011 | Stover et al. | |
| 2004/0202560 A1 | 10/2004 | Lin et al. | |
| 2009/0297379 A1 | 12/2009 | Stover et al. | |
| 2011/0050100 A1 | 3/2011 | Bailey et al. | |
| 2011/0146966 A1 | 6/2011 | Sherrer | |
| 2012/0235294 A1* | 9/2012 | Tang | H01L 23/473 257/714 |
| 2014/0119971 A1* | 5/2014 | Shiibayashi | F04C 23/008 418/55.5 |
| 2015/0152863 A1* | 6/2015 | Harashima | F04C 2/025 418/55.2 |

\* cited by examiner

COOLING ARRANGEMENT FOR COOLING AN APPARATUS

CROSS-REFERENCE TO PRIOR APPLICATIONS

This application is the U.S. National Phase application under 35 U.S.C. § 371 of International Application No. PCT/EP2017/055800, filed on Mar. 13, 2017, which claims the benefit of European Patent Application No. 16161203.1, filed on Mar. 18, 2016. These applications are hereby incorporated by reference herein.

TECHNICAL FIELD

The present invention relates to a cooling arrangement for cooling of an apparatus which when used may generate heat, which cooling arrangement utilizes a construction for generating a flow of fluid to which any heat that is generated may be transferred, which construction may operate similarly to a so called scroll compressor.

BACKGROUND

Operation of electrical devices, such as high-power semiconductor devices, high-power lasers, microprocessors and/or light emitting diodes (LEDs), is often associated with generation of heat. The heat is a byproduct that may have an injurious effect on performance and lifetime of the electrical device. Effective cooling is therefore useful and desired in many applications. For cooling of electrical devices which may generate heat when in use, or when operated, heat sinks which either employ free convection or forced convection are often used. Heat sinks based on free convention may however have some disadvantages. The heat transfer rate by way of convection and thermal radiation may be relatively low, and thereby passive heats sinks may be heavy and/or voluminous. Further, the cooling efficiency of such a heat sink may depend on its particular spatial orientation. Heat sinks based on forced convection, i.e. heat sinks which are used in conjunction with a fan, generally do not suffer from the above-mentioned drawbacks of heat sinks based on free convection. However, heat sinks based on forced convection may have other disadvantages. While the cooling efficiency of heat sinks based on forced convection is generally higher compared to that of heat sinks based on free convention, heat sinks based on forced convection generally require more installation space for accommodating the fan(s) and for example inlet(s) and outlet(s) for the fan(s). The fan may produce a relatively high level of noise. The fan may have a relatively limited lifetime, and may need to be replaced at relatively frequent intervals.

In view of the above discussion, a concern of the present invention is to provide a cooling arrangement for cooling of an apparatus which in use may generate heat, which addresses at least the above-discussed disadvantages with heat sinks based on forced convection.

To address at least one of this concern and other concerns, a cooling arrangement in accordance with the independent claim is provided. Preferred embodiments are defined by the dependent claims.

The cooling arrangement utilizes a construction for generating a flow of fluid to which any heat that is generated may be transferred, which construction may operate similarly to a so called scroll compressor. A scroll compressor is a compressor type in which two so called scrolls perform a relative orbiting motion, and where substantially symmetrical compression chambers for fluid such as a gas are formed between the two scrolls. The scrolls are constituted by spiral-shaped fins. In a scroll compressor there is usually a stationary scroll part having an exhaust opening at the center thereof, and a movable scroll part, which may be referred to as the orbiter, which is driven by an electrical motor. By the relative orbiting motion of the two scrolls, a volume of the compression chamber is progressively decreasing as the compression chamber moves toward the center of the scroll, compressing the gas held in the compression chamber, and thereby transporting the gas towards the center of the scroll where it can exit at the exhaust opening. The scroll compressor can thereby be used to generate a flow of the gas (or any other fluid). The orbiting motion of the orbiter with respect to the stationary scroll part can be generated by means of an eccentric mechanical part which is connecting the motor axis with the orbiter axis. The orbiter may hence be mounted eccentrically on the motor axis. The cooling arrangement may utilize such a drive unit, or drive system. In alternative or in addition the cooling arrangement may utilize an electromagnetic and/or electromechanical actuator based drive unit, as will be further described in the following.

According to a first aspect of the present invention there is provided a cooling arrangement for cooling of an apparatus which when used may generate heat. The cooling arrangement comprises a first member and a second member. The first member comprises a first base and a first spiral wrap, or first spiral fin, extending from the first base. The second member comprises a second base and a second spiral wrap, or second spiral fin, extending from the second base. The first spiral wrap and the second spiral wrap are interleaved, or interfitted. The first member is configured to at least thermally couple the apparatus thereto. At least one of the first member and the second member can be (possibly controllably) moved (possibly by means of the first member and the second member being configured or arranged appropriately) so as to result in an orbiting motion of one of the first spiral wrap and the second spiral wrap relatively to the other one of the first spiral wrap and the second spiral wrap, such that a volume of fluid in at least one space between the first spiral wrap and the second spiral wrap progressively moves during the orbiting motion, thereby generating a flow of fluid between the first spiral wrap and the second spiral. The flow of fluid may cool at least the first member by means of dissipation of heat generated by the apparatus by way of transfer of heat from the first member to the flow of fluid between the first spiral wrap and the second spiral.

By way of the first spiral wrap and the second spiral wrap of the first member and the second member, respectively, being interleaved, or interfitted, and by the at least one of the first member and the second member being movable so as to result in the above-mentioned orbiting motion such that a volume of fluid in at least one space between the first spiral wrap and the second spiral wrap progressively moves during the orbiting motion, the cooling arrangement may operate similarly to a so called scroll compressor (but possibly with only little or without compression of the fluid between the first spiral wrap and the second spiral wrap). The cooling arrangement can thereby be used to generate a flow of fluid such as a gas, e.g., air.

By the at least one of the first member and the second member being movable so as to result in the above-mentioned orbiting motion such that a volume of fluid in at least one space between the first spiral wrap and the second spiral wrap progressively moves during the orbiting motion, it is meant that at least one fluid 'pocket' between the first spiral wrap and the second spiral wrap is progressively or consecutively moved or displaced during the orbiting motion.

The at least one of the first member and the second member may be movable so as to result in the above-mentioned orbiting motion such that a volume of fluid, or fluid pocket, in at least one space between the first spiral wrap and the second spiral wrap progressively moves during the orbiting motion for example towards a center of at least one of the first member and the second member, where an exhaust or outlet may be arranged.

As mentioned in the foregoing, the first member is configured to at least thermally couple the apparatus thereto. By means of the flow of fluid generated between the first spiral wrap and the second spiral wrap, and hence between the first member and the second member, heat generated by the apparatus may be dissipated by way of transfer of heat from the first member to the flow of fluid between the first spiral wrap and the second spiral. Thus, the cooling arrangement provides for a heat sink solution based on forced convection (and which may be referred to as an active heat sink), which may operate similarly to a so called scroll compressor. In contrast to most heat sinks based on forced convention, the cooling arrangement does not require a fan for creating a fluid flow. Rather, the means of creating the fluid flow in the cooling arrangement, i.e. the first member and the second member, are constituted in part by the heat sink itself, i.e. the first member, which is configured to at least thermally couple the apparatus thereto. Thereby, the cooling arrangement may require less installation space compared to most other heat sinks based on forced convention.

A cooling arrangement according to the first aspect may for example be employed for cooling of electronic equipment, such as cooling of lighting devices based on light-emitting diodes, such as downlights, spot luminaires, etc.

In alternative or in addition, the second member may be configured to at least thermally couple the apparatus thereto (possibly instead of the first member).

The cooling arrangement may be used for cooling of several apparatuses which in use may generate heat. The first member may be configured to at least thermally couple at least one of the apparatuses thereto, and the second member may be configured to at least thermally couple at least one (other) of the apparatuses thereto.

In the context of the present application, by spiral it is meant a curve on a plane that winds around a central point at a continuously increasing or decreasing distance from the central point. Thus, each of the first spiral wrap and the second spiral wrap represents a structure having walls which similarly to a spiral revolves around a central point, as seen from above the first and second base, respectively. The spacing between different turns of the first spiral wrap and/or the second spiral wrap may be the same, or it may differ at least between some turns.

In the context of the present application, by the first spiral wrap and the second spiral wrap being interleaved, or interfitted, it is meant that they are arranged in or as if in alternate layers.

Each of the first spiral wrap and the second spiral wrap may for example have an involute (or evolvent) geometry or shape. That is to say, the walls of each of the first spiral wrap and the second spiral wrap may, when seen from the above (of the first member and second member, respectively), exhibit a shape similar to an involute or evolvent curve. However, other geometries or shapes of the first spiral wrap and/or the second spiral wrap are possible.

At least one of the first member and the second member may be moved so as to result in an orbiting motion of one of the first spiral wrap and the second spiral wrap relatively to the other one of the first spiral wrap and the second spiral wrap such that one of the first spiral wrap and the second spiral wrap is driven to orbit eccentrically relatively to the other one of the first spiral wrap and the second spiral wrap.

According to one or more embodiments of the present invention, both the first member and the second member are movable, and possibly both of them are moved so as to result in the orbiting motion of one of the first spiral wrap and the second spiral wrap relatively to the other one of the first spiral wrap. In alternative, one of the first member and the second member may be movable with the other one being fixedly arranged (in the apparatus). For example, first member may be fixedly arranged (in the cooling arrangement) and the second member may be movable relatively to the first member. The second member may be controllably moved with respect to the first member so as to result in an orbiting motion of the second spiral wrap relatively to the first spiral wrap, possibly such that the second spiral wrap is driven to orbit eccentrically relatively to the first spiral wrap. Thus, the first member and the second member may be arranged such that the second spiral wrap can be driven to orbit eccentrically relatively to the first spiral wrap.

In the context of the present application, by one spiral wrap being driven to orbit eccentrically relatively to another spiral wrap it is meant that one spiral wrap is orbiting around an axis that is different from the center axis of the other spiral wrap.

The orbiting motion of one of the first spiral wrap and the second spiral wrap relatively to the other one of the first spiral wrap and the second spiral wrap may be such that the one of the first spiral wrap and the second spiral wrap may at least during part of the orbiting motion possibly is in sliding contact with the other one of the first spiral wrap and the second spiral wrap, so as to minimize radial gap between the spiral wraps. This may possibly improve the pumping efficiency.

The cooling arrangement, or at least one of the first member and the second member, may comprise an inlet, which permits fluid to enter between the first spiral wrap and the second spiral wrap. At least one of the first member and the second member may comprise an outlet for outputting the flow of fluid generated between the first spiral wrap and the second spiral wrap. Thereby, fluid may be conveyed between the inlet and the outlet.

At least one of first spiral wrap and the second spiral wrap may be arranged such that it is wrapped at most 1.5 revolutions about its origin. Thereby, fluid 'pockets' between the first spiral wrap and the second spiral wrap will during the orbiting motion never fully be closed off, so as to facilitate or allow for fluid to escape from between the first spiral wrap and the second spiral wrap towards the outlet. Such a configuration may be useful for example in case the cooling arrangement will be used to generate an air flow, or air jet. However, in case one of the first member and the second member is stationary and the other is movable (for example, if the first member is fixedly arranged and the second member is movable relatively to the first member), the stationary member may be arranged such that it is wrapped more than 1.5 revolutions about its origin while still facilitating or allowing for fluid to escape from between the first spiral wrap and the second spiral wrap towards the outlet. In that way, the surface area available for cooling becomes larger.

The cooling arrangement may comprise a heat spreader, which may be coupled to the first member. The first member may be configured to couple the apparatus to the first member via the heat spreader. The heat spreader may for example comprise an intermediate element or component arranged on a surface of the first member, via which intermediate element or component the apparatus may be coupled to the first member, for improving the thermal coupling between the apparatus and the first member. The heat spreader may for example comprise a plate or the like. The heat spreader may for example comprise a material having a relatively high thermal conductivity, such as copper or aluminum. In alternative or in addition the heat spreader may for example comprise thermal interface material (TIM) such as thermal grease.

The cooling arrangement may comprise a drive unit configured to controllably move at least one of the first member and the second member so as to result in the orbiting motion.

The drive unit may for example comprise at least one electromagnetic and/or electromechanical actuator configured to controllably generate forces, e.g., electromagnetic forces, which affect the at least one of the first member and the second member in order to controllably move the at least one of the first member and the second member so as to result in the orbiting motion. The cooling arrangement may hence utilize an electromagnetic and/or electromechanical actuator based drive unit for moving at least one of the first member and the second member. For example, by means of such a drive unit, less or no bearings may be required in order to operate the cooling arrangement, and therefore no or only little noise may be generated during operation of the cooling arrangement, and there may be less need for replacing worn-out part of the cooling arrangement (bearings may become worn out relatively quickly), as compared to a drive system having a motor with the orbiter being mounted eccentrically on the motor axis.

The at least one electromagnetic and/or electromechanical actuator may for example be a linear actuator. The at least one electromagnetic and/or electromechanical actuator may for example be configured to controllably generate forces which affect the at least one of the first member and the second member in order to controllably move the at least one of the first member and the second member in motions along different straight axes so as to result in the orbiting motion. The at least one electromagnetic and/or electromechanical actuator may hence, according to one or more embodiments of the present invention, be referred to as a 'linear' actuator.

The at least one electromagnetic and/or electromechanical actuator of the drive unit may for example comprise a static wire coil, which when energized may create a magnetic field. The first member and/or the second member, or some other element(s) which may be coupled to and/or supporting the first member and/or the second member, may when exposed to the magnetic field be attracted to or repelled by the static wire coil, thereby effecting movement (possibly controllable) of the first member and/or the second member. The at least one electromagnetic and/or electromechanical actuator may for example operate similarly to a solenoid or a linear electromagnetic motor, both of which as such are known in the art.

In alternative or in addition the electromagnetic and/or electromechanical actuator may for example comprise a piezoelectric actuator, which for example may utilize one or more piezoelectric crystals or materials, which may change at least one dimension thereof when an external electric field is applied to the piezoelectric crystal(s) or material(s). Thereby, the electromagnetic and/or electromechanical actuator may be configured to produce a force responsive to application of an external electric field.

It is to be understood that the above-described types of electromagnetic and/or electromechanical actuators are according to non-limiting examples, and that the drive unit may employ another or other types of electromagnetic and/or electromechanical actuators.

The at least one electromagnetic and/or electromechanical actuator may be configured to controllably generate forces, e.g., electromagnetic forces, which (directly or indirectly) may affect the at least one of the first member and the second member in order to controllably move the at least one of the first member and the second member along at least two mutually perpendicular imaginary axes in respective oscillatory motions, resulting in the orbiting motion of one of the first spiral wrap and the second spiral wrap relatively to the other one of the first spiral wrap and the second spiral wrap. The at least one electromagnetic and/or electromechanical actuator may be configured to controllably generate forces which affect the at least one of the first member and the second member in order to controllably move the at least one of the first member and the second member along at least two mutually perpendicular imaginary axes in respective oscillatory motions having controllable amplitude and/or controllable phase. The above-mentioned orbiting motion may for example be generated by way of two mutually perpendicular, or orthogonal, mechanical oscillatory movements by the first member and the second member, respectively, which respective oscillatory movements may have a phase difference of 90° ($\pi/2$ radians), or about 90° (e.g., the oscillations being phase-shifted relatively to each other), and possibly have the same (or substantially the same) amplitude. The respective oscillatory movements may for example have an oscillation frequency between about 20 Hz and about 50 Hz.

As mentioned in the foregoing, the forces may directly affect the at least one of the first member and the second member in order to controllably move the at least one of the first member and the second member so as to result in the orbiting motion. For example, at least a portion of the at least one of the first member and the second member may be magnetic. The at least one electromagnetic and/or electromechanical actuator may be configured to controllably apply forces onto at least a portion of at least one of the first member and the second member (in order to controllably move the at least one of the first member and the second member so as to result in the orbiting motion).

In alternative or in addition, the forces may indirectly affect the at least one of the first member and the second member in order to controllably move the at least one of the first member and the second member so as to result in the orbiting motion. The cooling arrangement may for example comprise a support structure (or suspension), wherein at least a portion of the support structure is configured to resiliently support (or suspend) at least one of the first member and the second member in the cooling arrangement while permitting movement of the at least one of the first member and the second member resulting in the orbiting motion. For example, at least a portion of the support structure may be magnetic. The at least one electromagnetic and/or electromechanical actuator may be configured to controllably apply forces onto at least a portion of the support structure in order to controllably move the at least one of the first member and the second member so as to result in the orbiting motion. The movement of the at least one of the first member and the second member may be effected by way of the resilient supporting of the at least one of the first member and the second member by the support structure. According to another example the at least one electromagnetic and/or electromechanical actuator may comprise one or more piezoelectric crystals or elements, which may be (possibly directly) arranged on or mounted to at least a portion of the support structure, for controllably generating forces which affect at least one of the first member and the second member in order to controllably move the at least one of the first member and the second member so as to result in the orbiting motion.

The first member may be configured to couple the apparatus thereto. That is to say, the first member may be configured to mechanically (and not only thermally) couple the apparatus thereto.

The first base may comprise a first side and a second side. The first spiral wrap may for example extend from the first side. The first member may be configured to couple the apparatus to the second side. The second side of the first base may for example be opposite to the first side of the first base.

According to a second aspect there is provided a system which comprises an apparatus, which when used may generate heat. The system further comprises a cooling arrangement according to the first aspect for dissipating heat generated by the apparatus when it is used. The cooling arrangement is at least thermally coupled to the first member of the apparatus. The cooling arrangement may be comprised in the apparatus.

The apparatus may for example comprise a light-emitting device configured to emit light when in use. However, it is to be understood that this is according to a non-limiting example, and the apparatus may comprise in principle any apparatus that may generate heat when used, such as, for example, an electrical apparatus.

The light emitting device may for example comprise a carrier substrate, such as, for example, a printed circuit board, on which one or more light-emitting diodes (LEDs) may be arranged. The carrier substrate may possibly be coupled or connected to the second side of the first member. The carrier substrate may for example comprise a printed circuit board, which may be flexible, or substantially rigid, e.g., including a metal core printed circuit board. In alternative or in addition the carrier substrate may comprise a flexible foil. In alternative or in addition, the light emitting device may comprise one or more other types of solid state light emitter other than LED.

Further objects and advantages of the present invention are described in the following by means of exemplifying embodiments. It is noted that the present invention relates to all possible combinations of features recited in the claims. Further features of, and advantages with, the present invention will become apparent when studying the appended claims and the description herein. Those skilled in the art realize that different features of the present invention can be combined to create embodiments other than those described herein.

BRIEF DESCRIPTION OF THE DRAWINGS

Exemplifying embodiments of the invention will be described below with reference to the accompanying drawings.

All the figures are schematic, not necessarily to scale, and generally only show parts which are necessary in order to elucidate embodiments of the present invention, wherein other parts may be omitted or merely suggested.

DETAILED DESCRIPTION

The present invention will now be described hereinafter with reference to the accompanying drawings, in which exemplifying embodiments of the present invention are shown. The present invention may, however, be embodied in many different forms and should not be construed as limited to the embodiments of the present invention set forth herein; rather, these embodiments of the present invention are provided by way of example so that this disclosure will convey the scope of the invention to those skilled in the art. In the drawings, identical reference numerals denote the same or similar components having a same or similar function, unless specifically stated otherwise.

Figure 1:
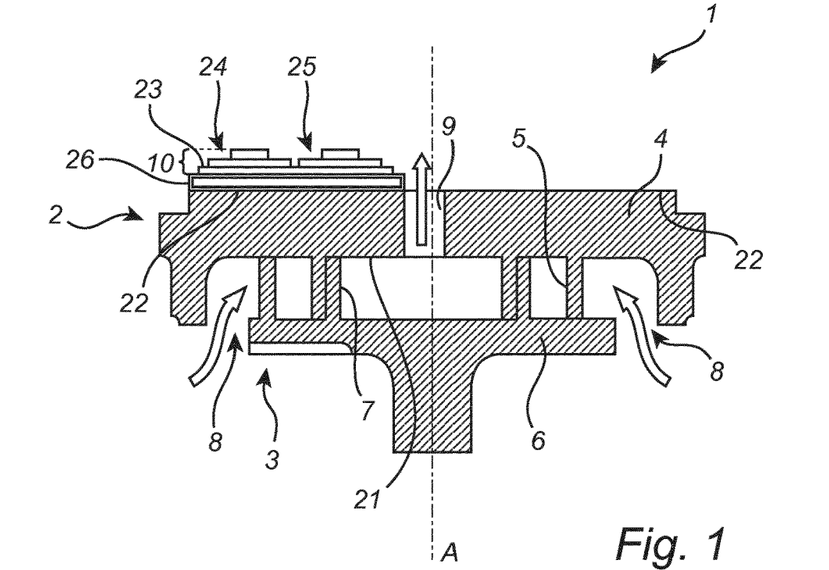
FIG. 1 is a schematic cross-sectional view of a system comprising a cooling arrangement and an apparatus according to an embodiment of the present invention.

FIG. 1 is a schematic cross-sectional view of system 1, 10 comprising a cooling arrangement 1 and an apparatus 10 according to an embodiment of the present invention. The apparatus 10, which will be described further in the following, may generate heat when used. The cooling arrangement 1 is configured to dissipate heat generated by the apparatus 10 when in use by means of forced convection.

Figure 2:
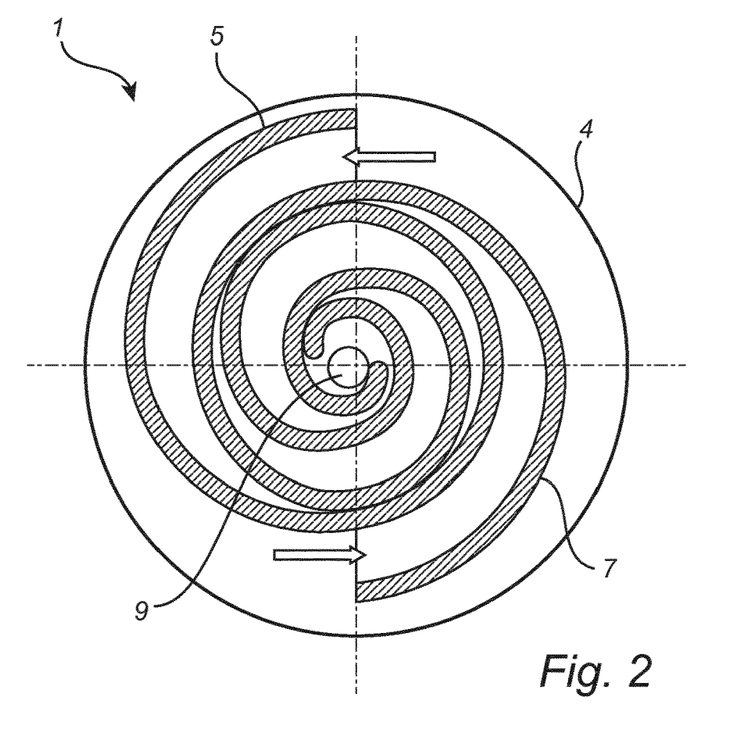
FIG. 2 is a schematic view of parts of a cooling arrangement according to an embodiment of the present invention.

The cooling arrangement 1 comprises a first member 2 and a second member 3. The first member 2 comprises a first base 4 and a first spiral wrap 5 (or first spiral fin) extending from the first base 4. The second member 3 comprises a second base 6 and a second spiral wrap 7 (or second spiral fin) extending from the second base 6. In accordance with the embodiment of the present invention illustrated in FIG. 1, the first base 4 and the second base 6 may have a generally cylindrical, or disc-like, shape. The cross-section shown in FIG. 1 is in a plane in which a center axis A of the cooling arrangement 1 (and the first member 2 and the second member 3) lies. The cooling arrangement 1 comprises inlets 8 which permit fluid (e.g., a gas such as air, or a liquid) to enter between the first spiral wrap 5 and the second spiral wrap 7, as indicated in FIG. 1 by the arrows at the inlets 8. The first member 2 comprises an outlet 9 for outputting a flow of fluid generated between the first spiral wrap 5 and the second spiral wrap 7. In accordance with the embodiment of the present invention illustrated in FIG. 1, the outlet 9 comprises a through-hole at the center of the first base 4 of the first member 2, but variations are possible. The output of a flow of fluid generated between the first spiral wrap 5 and the second spiral wrap 7 is indicated by the arrow at the outlet 9. The first spiral wrap 5 and the second spiral wrap 7 are interleaved, or interfitted. This is illustrated in FIG. 2, which is a schematic view of parts of a cooling arrangement 1 according to an embodiment of the present invention. In FIG. 2, the first spiral wrap 5, the second spiral wrap 7 and the first base 4 of the first member 2 are depicted as viewed from the above of the surface of the first base 4 from which the first spiral wrap 5 extends. Similarly to the embodiment of the present invention illustrated in FIG. 1, the first member 2 illustrated in FIG. 2 comprises an outlet 9 in the form of a through-hole at the center of the first base 4 of the first member 2 for outputting a flow of fluid generated between the first spiral wrap 5 and the second spiral wrap 7.

With further reference to FIG. 1, the first base 4 may comprise a first side 21 and a second side 22. The first spiral wrap 5 may for example extend from the first side 21, as indicated in FIG. 1. The first member 2 is configured to at least thermally couple the apparatus 10 thereto. In accordance with the embodiment of the present invention illustrated in FIG. 1, the first member 2 may be configured to couple the apparatus 10 to the second side 22 of the first base 4. As indicated in FIG. 1, the second side 22 of the first base 4 may for example be opposite to the first side 21 of the first base 4.

In accordance with the embodiment of the present invention illustrated in FIG. 1, the apparatus 10 comprises a light-emitting device 23, 24, 25 configured to emit light when in use. However, it is to be understood that this is according to a non-limiting example, and the apparatus 10 may comprise in principle any apparatus which may generate heat when used, such as, for example, an electrical apparatus. The light emitting device 23, 24, 25 of the cooling arrangement 1 illustrated in FIG. 1 comprises a carrier substrate 23, which for example may comprise or be constituted by a printed circuit board, on which one or more light-emitting diodes (LEDs) 24, 25 are arranged. In FIG. 1 there are two LEDs 24, 25 depicted. It is however to be understood that the apparatus 10 may comprise a light-emitting device having only a single LED, or more than two LEDs. The LEDs 24, 25 may be mechanically supported on the carrier substrate 23, and may be provided with power via current paths which for example may be arranged on the surface of the carrier substrate 23 on which the LEDs 24, 25 are arranged.

In accordance with the embodiment of the present invention illustrated in FIG. 1, the cooling arrangement 1 may comprise a heat spreader 26, which may be coupled to the (second side 22 of the first base 4 of the) first member 2. The first member 2 is configured to couple the apparatus 10 to the first member 2 via the heat spreader 26, so as to achieve a thermal coupling between the apparatus 10 and the first member 2. In accordance with the embodiment of the present invention illustrated in FIG. 1, the heat spreader 26 may for example comprise a plate made of a material having a relatively high thermal conductivity, such as copper or aluminum.

With further reference to FIG. 1, the diameter of the first spiral wrap 5 and the second spiral wrap 7 may for example be between about 30 mm to about 60 mm, and the height (i.e. in a direction parallel to the central axis A) of the first spiral wrap 5 and the second spiral wrap 7 may for example be between about 10 mm to about 20 mm. The through-hole of the outlet 9 may for example have a diameter between about 5 mm and about 10 mm, such as, for example, about 6 mm.

In accordance with the embodiments of the present invention illustrated in FIGS. 1 and 2, the first member 2 may be stationary (that is, not movable, and possibly fixedly arranged in the cooling arrangement 1), and the second member 3 may be movable relatively to the first member 2. The second member 3 may be moved relatively to the first member 2 so as to result in an orbiting motion of the second spiral wrap 7 relatively to the first spiral wrap 5, for example as seen in the plane illustrated in FIG. 2, such that a volume of fluid in at least one space (as indicated in FIG. 2) between the first spiral wrap 5 and the second spiral wrap 7 progressively moves during the orbiting motion, thereby generating a flow of fluid between the first spiral wrap 5 and the second spiral wrap 7, which flow of fluid cools the first member 2 by means of dissipation of heat generated by the apparatus 10 by way of transfer of heat from the first member 2 to the flow of fluid between the first spiral wrap 5 and the second spiral wrap 7.

By way of the first spiral wrap 5 and the second spiral wrap 7 of the first member 2 and the second member 3, respectively, being interleaved or interfitted, and by the at least one of the first member 2 and the second member 3 being movable so as to result in the above-mentioned orbiting motion, such that a volume of fluid in at least one space between the first spiral wrap 5 and the second spiral wrap 7 progressively moves during the orbiting motion, the cooling arrangement 1 may operate similarly to a so called scroll compressor. The cooling arrangement 1 can thereby be used for example for generating a flow of fluid such as a gas, e.g., air, or a liquid. Thereby, the cooling arrangement 1 may achieve cooling of the apparatus 10 by means of forced convection.

It to be understood that according to one or more embodiments of the present invention, both the first member 2 and the second member 3 may be movable, and possibly both of them may be moved so as to result in an orbiting motion of one of the first spiral wrap 5 and the second spiral wrap 7 relatively to the other one of the first spiral wrap 5 and the second spiral wrap 7.

The cooling arrangement 1 may comprise a drive unit (not shown in FIG. 1 or 2), which is configured to controllably move at least one of the first member 2 and the second member 3, resulting in an orbiting motion of one of the first spiral wrap 5 and the second spiral wrap 7 relatively to the other one of the first spiral wrap 5 and the second spiral wrap 7, such that a volume of fluid in at least one space between the first spiral wrap 5 and the second spiral wrap 7 progressively moves during the orbiting motion, thereby generating a flow of fluid between the first spiral wrap 5 and the second spiral 7. As will be further described in the following, the drive unit may for example comprise at least one electromagnetic actuator (not shown in FIG. 1 or 2). The at least one electromagnetic actuator may be configured to controllably generate electromagnetic forces which affect the at least one of the first member 2 and the second member 3 in order to controllably move the at least one of the first member 2 and the second member 3 so as to result in the orbiting motion. The drive unit and the at least one electromagnetic actuator will be described further in the following with reference to FIGS. 3 and 4. In alternative or in addition the drive unit may for example comprise a motor which drives the second member 3 and an eccentric mechanical part which is connecting an axis of the motor axis with an axis of the second member 3. The second member 3 may hence be mounted or arranged eccentrically on the motor axis, so as to allow for the second spiral wrap 7 to be driven to orbit eccentrically relatively to the first spiral wrap 5. Thus, the first member 2 and the second member 3 may be arranged such that the second spiral wrap 7 can be driven to orbit eccentrically relatively to the first spiral wrap 5. In alternative or in addition the drive unit may for example comprise at least one electromechanical actuator, such as, for example, a piezoelectric actuator, which is configured to controllably generate forces which affect the at least one of the first member 2 and the second member 3 in order to controllably move the at least one of the first member 2 and the second member 3 so as to result in the orbiting motion.

Figure 3:
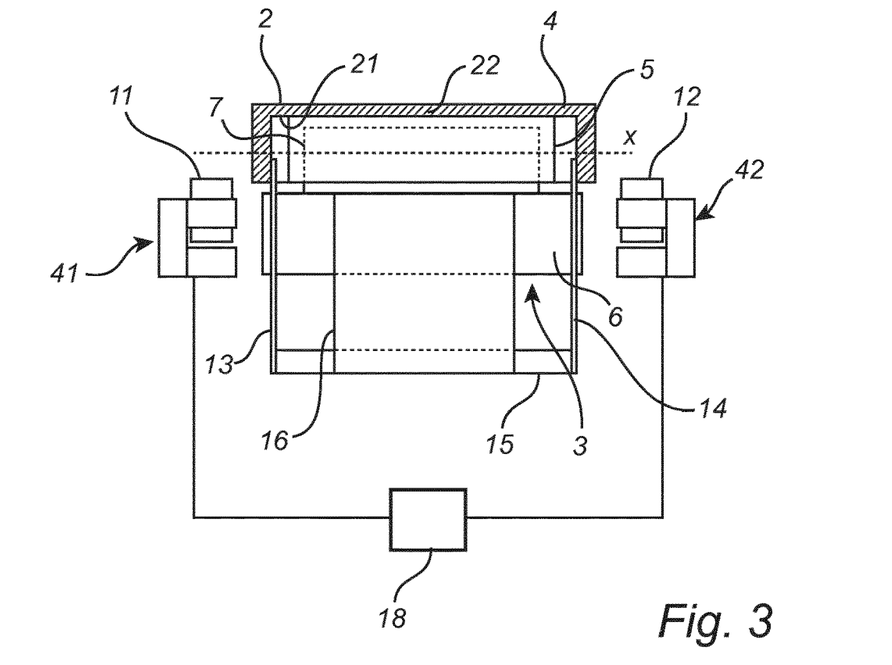
FIGS. 3 and 4 are schematic, in part cross-sectional side views of cooling arrangements according to embodiments of the present invention.

FIG. 3 is a schematic, in part cross-sectional side view of a cooling arrangement 1 according to an embodiment of the present invention. The cooling arrangement 1 comprises a first member 2. The first member 2 comprises a first base 4 and a first spiral wrap 5 extending from the first base 4. The cooling arrangement 1 further comprises a second member 3. The second member 3 comprises a second base 6 and a second spiral wrap 7 extending from the second base 6. It is to be understood that the first spiral wrap 5 and the second spiral wrap 7 illustrated in FIG. 3 are only very schematic. While the first spiral wrap 5 and the second spiral wrap 7 illustrated in FIG. 3 indicate the respective positions thereof in relation to other components of the cooling arrangement 1, they for example do not show the individual wraps or layers of the first spiral wrap 5 and the second spiral wrap 7, respectively. Although not explicitly shown in FIG. 3, the first spiral wrap 5 and the second spiral wrap 7 are interleaved, or interfitted.

The first member 2 is configured to at least thermally couple an apparatus thereto. The apparatus is not shown in FIG. 3 (cf. FIG. 1). The apparatus generates heat when used, and the cooling arrangement 1 is configured to dissipate heat generated by the apparatus when in use, by means of forced convection via a flow of fluid between the first spiral wrap 5 and the second spiral wrap 7.

Similarly to the embodiments of the present invention illustrated in FIGS. 1 and 2, in accordance with the embodiment of the present invention illustrated in FIG. 3 the first member 2 is stationary (that is, not movable, and possibly fixedly arranged in the cooling arrangement 1), and the second member 3 is movable relatively to the first member 2. The second member 3 can be moved relatively to the stationary first member 2 so as to result in an orbiting motion of the second spiral wrap 7 relatively to the first spiral wrap 5, such that a volume of fluid in at least one space (not indicated in FIG. 3) between the first spiral wrap 5 and the second spiral wrap 7 progressively moves during the orbiting motion, thereby generating a flow of fluid between the first spiral wrap 5 and the second spiral wrap 7, which flow of fluid cools the first member 2 by means of dissipation of heat generated by the apparatus by way of transfer of heat from the first member 2 to the flow of fluid between the first spiral wrap 5 and the second spiral wrap 7. The flow of fluid may for example exit the cooling arrangement 1 via an outlet (not shown in FIG. 3) which may be arranged in the first member 2, similarly to the embodiments of the present invention described with reference to FIGS. 1 and 2.

It is however to be understood that according to one or more embodiments of the present invention both the first member 2 and the second member 3 may be movable, and possibly both of them may be moved so as to result in an orbiting motion of one of the first spiral wrap 5 and the second spiral wrap 7 relatively to the other one of the first spiral wrap 5 and the second spiral wrap 7.

In accordance with the embodiment of the present invention illustrated in FIG. 3, the cooling arrangement 1 comprises a drive unit 11, 12, which is configured to controllably move the second member 3 resulting in an orbiting motion of the second spiral wrap 7 relatively to the first spiral wrap 5 such that a volume of fluid in at least one space between the first spiral wrap 5 and the second spiral wrap 7 progressively moves during the orbiting motion, thereby generating a flow of fluid between the first spiral wrap 5 and the second spiral 7.

According to the embodiment of the present invention illustrated in FIG. 3, the drive unit 11, 12 comprises electromagnetic actuators 11, 12. And further in accordance with the embodiment of the present invention illustrated in FIG. 3, according to which the first member 2 is stationary and the second member 3 is movable relatively to the first member 2, the electromagnetic actuators 11, 12 are configured to controllably generate electromagnetic forces which affect the second member 3 in order to controllably move the second member 3 relatively to the first member 2 (or the second spiral wrap 7 relatively to the first spiral wrap 5) so as to result in the orbiting motion.

In accordance with the embodiment of the present invention illustrated in FIG. 3, the electromagnetic actuators 11, 12 may generate electromagnetic forces which indirectly or directly affect the second member 3 in order to controllably move the second member 3 so as to result in the orbiting motion. The cooling arrangement 1 comprises a support structure 13-16 configured to resiliently support the second member 3 in the cooling arrangement 1 while permitting movement of the second member 3 resulting in the orbiting motion. The electromagnetic actuators 11, 12 are configured to controllably apply electromagnetic forces onto at least a portion of the support structure 13-16 and/or possibly on at least a portion of the second member 3 in order to controllably move the second member 3 so as to result in the orbiting motion, wherein the movement of the second member 3 may be effected by way of the resilient supporting of the second member 3 by the support structure 13-16.

In accordance with the embodiment of the present invention illustrated in FIG. 3 the support structure 13-16 comprises a plurality of springs 13, 14, 16. The springs 13, 14, 16 may for example comprise or be constituted by leaf springs, which for example may be made of steel. It is however to be understood that the springs may be constituted by or comprise other types of springs.

Further in accordance with the embodiment of the present invention illustrated in FIG. 3 the second member 3 is resiliently supported by means of the springs 13, 14, 16. As indicated in FIG. 3, each of the springs 13, 14 provides for a resilient interconnection of the second member 3 with a fixed portion of the cooling arrangement 1. By way of example, the fixed portion of the cooling arrangement 1 may be constituted by the first member 2, which as mentioned in the foregoing may be stationary. That is, the first member 2 may be not movable, and may possibly be fixedly arranged in the cooling arrangement 1. The fixed portion of the cooling arrangement 1 may in alternative or in addition be constituted by another portion or other portions of the cooling arrangement 1.

In accordance with the embodiment of the present invention illustrated in FIG. 3, by way of the resilient supporting of the second member 3 by the support structure 13-16, the second member 3 is movable along two mutually perpendicular imaginary axes. One of the axes is indicated in FIG. 3 by the dashed line indicated by "x" in FIG. 3. The other axis y is perpendicular to the axis x, and is directed into the plane depicted in FIG. 3. That is, the other axis y is extending in a direction which is perpendicular to the plane depicted in FIG. 3.

Further in accordance with the embodiment of the present invention illustrated in FIG. 3, the movement of the second member 3 along the axis x is achieved by way of the arrangement of the pair of springs 13, 14 wherein the second member 3 is interposed in between the pair of springs 13, 14 in a direction along the axis x. The movement of the second member 3 along the other axis y, which is perpendicular to the axis x, is achieved by way of an arrangement of a pair of springs which includes the spring 16 and another spring, which is not shown in FIG. 3, and which is arranged behind the spring 16 in FIG. 3. That other spring may for example comprise or be constituted by a leaf spring, just as the springs 13, 14, 16 may be. The spring 16 and the other spring which is arranged behind the spring 16 are arranged so that the second member 3 is interposed in between those springs in a direction along the axis y that is perpendicular to the axis x.

In accordance with the embodiment of the present invention illustrated in FIG. 3, each of the springs 13, 14, 16 (and the other spring, which is not shown in FIG. 3 and which is arranged behind the spring 16 in FIG. 3) is connected to an intermediate body 15. The intermediate body 15, which is optional, may be movable along an axis parallel to the axis x.

The electromagnetic actuators 11, 12 are configured to controllably apply electromagnetic forces onto at least a portion of the second member 3 and/or the support structure, for example onto at least a portion of the springs 13, 14, in order to controllably move the second member 3 along the axis x in an oscillatory motion. The cooling arrangement 1 may comprise additional electromagnetic actuators (not shown in FIG. 3) which may be configured to controllably apply electromagnetic forces onto at least a portion of the second member 3 and/or the support structure, for example onto at least a portion of the spring 16, and the other spring which is arranged behind the spring 16, in order to controllably move the second member 3 along the axis y that is perpendicular to the axis x in an oscillatory motion. Thereby, by way of the electromagnetic actuators the second member 3 may be controllably moved along the respective ones of the above-mentioned axes x and y, in respective oscillatory motions, so as to result in the orbiting motion. Possibly, the second member 3 may be controllably moved by way of the electromagnetic actuators (inter alia the electromagnetic actuators 11, 12) along the respective ones of the above-mentioned axes x and y, in respective oscillatory motions having controllable amplitude and/or phase, so as to result in the orbiting motion. The respective oscillatory movements along the axes x and y may for example have an oscillation frequency between about 20 Hz and about 50 Hz. The respective oscillatory movements along the axes x and y may have a phase difference of 90° ($\pi/2$ radians), or about 90° (e.g., the oscillations being phase-shifted relatively to each other), and possibly have the same (or substantially the same) amplitude.

The cooling arrangement 1 may comprise at least one sensor configured to continually or continuously sense a position of the first member 2 and/or the second member 3. In accordance with the embodiment of the present invention illustrated in FIG. 3, the cooling arrangement 1 comprises two sensors, which are schematically indicated at 41 and 42 and which are configured to continually or continuously sense a position of the second member 3. The controllable movement of the second member 3 by way of the electromagnetic actuators (inter alia the electromagnetic actuators 11, 12) along the respective ones of the above-mentioned axes x and y, in respective oscillatory motions having controllable amplitude and/or phase, which movement results in the orbiting motion, may be based on at least one sensed position of the second member 3.

The sensors 41 and 42 may be configured to continually or continuously sense a position of the second member 3 along the axis x. There may however be only one sensor, or more than two sensors, which continually or continuously sense a position of the second member 3 along the axis x. At least one of the sensors 41 and 42, or at least one other sensor not shown in FIG. 3, may be configured to continually or continuously sense a position of the second member 3 along the above-mentioned axis y that is perpendicular to the axis x.

In general, the at least one sensor may be integrally arranged with the at least one electromagnetic actuator, or vice versa. In accordance with the embodiment of the present invention illustrated in FIG. 3, the sensors 41 and 42 may be integrally arranged with the electromagnetic actuators 11 and 12, respectively. Such sensors which are integrally arranged with respective electromagnetic actuators may for example be implemented or realized by way of so called self sensing actuators, which as such are known in the art. As known in the art, a self sensing actuator may be capable of providing both the sensing functionality of the sensor and the actuation functionality of the electromagnetic actuator. In alternative or in addition, the at least one sensor may for example comprise at least one capacitive sensor, strain gauge and/or optical sensor for continually or continuously sensing a position of the first member 3 (and/or the second member 2 if movable). In alternative or in addition, the at least one sensor may for example comprise a Hall sensor.

In accordance with the embodiment of the present invention illustrated in FIG. 3, the cooling arrangement 1 may comprise a control unit 18, or a control and processing unit.

The control unit 18 or the control and processing unit may be configured to control operation of the electromagnetic actuators 11, 12 (possibly individually) by means of communication of appropriate control signals or messages therewith or thereto. The control unit 18 or the control and processing unit may be communicatively coupled or connected with any electromagnetic actuators of the cooling arrangement 1, such as the electromagnetic actuators 11, 12, and possibly with any sensors, such as the sensors 41 and 42, for example by way of any appropriate communication means or technique as known in the art. Although there in FIG. 3 are indicated wired connections between the control unit 18 and the electromagnetic actuators 11, 12 and the sensors 41 and 42, respectively, it is to be understood that the communicative coupling or connection between the control unit 18 and the electromagnetic actuators 11, 12 and the sensors 41 and 42, respectively, may be wireless and/or wired. By way of the communicative coupling or connection between the control unit 18 and the sensors 41 and 42, sensed positions of the second member 3 (as sensed by the sensors 41 and 42) may be received or retrieved by the control unit 18.

The control unit 18 or the control and processing unit may be configured to, using a feedback loop based on sensed positions of the second member 3, control the electromagnetic actuators (inter alia the electromagnetic actuators 11, 12) to generate electromagnetic forces onto at least a portion of the second member 3 and/or the support structure, for example onto at least a portion of the springs 13, 14, in order to controllably move the second member 3 along the axis x in an oscillatory motion having controllable amplitude and/or phase, and control the additional electromagnetic actuators (not shown in FIG. 3) which are configured to controllably apply electromagnetic forces onto at least a portion of the second member 3 and/or the support structure, for example onto at least a portion of the spring 16, and the other spring which is arranged behind the spring 16, in order to controllably move the second member 3 along the axis y that is perpendicular to the axis x in an oscillatory motion having controllable amplitude and/or phase. By means of the respective oscillatory motions having controllable amplitude and/or phase the orbiting motion may be achieved.

The control unit 18 or the control and processing unit may for example comprise or be constituted by any suitable central processing unit (CPU), microcontroller, digital signal processor (DSP), Application Specific Integrated Circuit (ASIC), Field Programmable Gate Array (FPGA), etc., or any combination thereof. The control unit 18 may optionally be capable of executing software instructions stored in a computer program product e.g. in the form of a memory. The memory may for example be any combination of read and write memory (RAM) and read only memory (ROM). The memory may comprise persistent storage, which for example can be a magnetic memory, an optical memory, a solid state memory or a remotely mounted memory, or any combination thereof.

Figure 4:
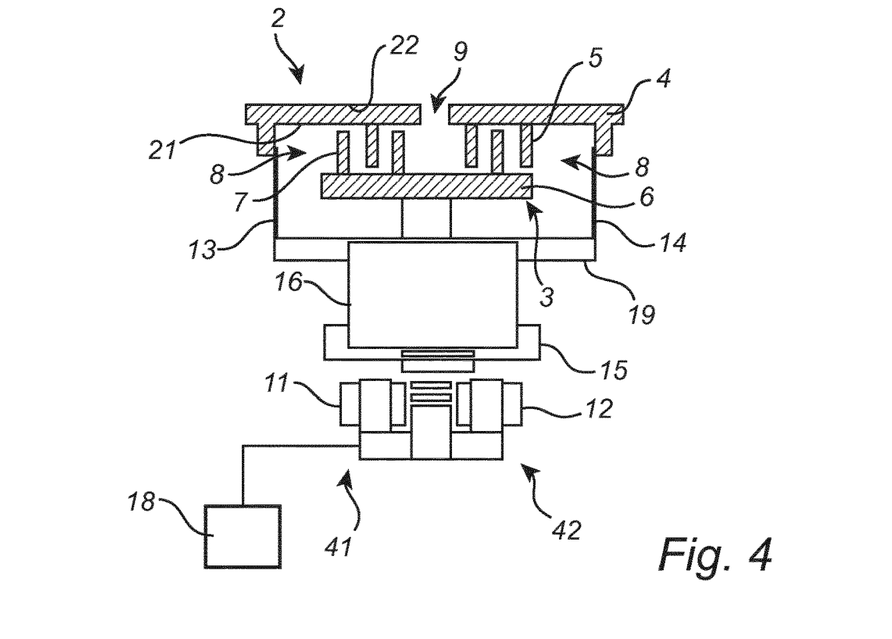

FIG. 4 is a schematic, in part cross-sectional side view of a cooling arrangement 1 according to an embodiment of the present invention. The cooling arrangement 1 illustrated in FIG. 4 is similar to the cooling arrangement 1 illustrated in FIG. 3. Identical reference numerals in FIGS. 3 and 4 denote the same or similar components, which have the same or similar functionality, unless stated otherwise. Similarly to cooling arrangement 1 illustrated in FIG. 3, the second member 3 of the cooling arrangement 1 illustrated in FIG. 4 is resiliently supported by means of a support structure (the support structure in the cooling arrangement 1 illustrated in FIG. 3 comprises the components indicated by reference numerals 13-16). The support structure of the cooling arrangement 1 illustrated in FIG. 4 differs from the support structure 13-16 in the cooling arrangement 1 illustrated in FIG. 3 in that there are two intermediate bodies 15 and 19 (which are optional), whereas in the cooling arrangement 1 illustrated in FIG. 3 there is only one intermediate body 15. As illustrated in FIG. 4, the first spiral wrap 5 should nearly be in contact with the second base of the second member 3, and the second spiral wrap 7 should nearly be in contact with the first base 4 of the first member 2, in order to minimize leakage of fluid.

While the present invention has been illustrated in the appended drawings and the foregoing description, such illustration is to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. In the appended claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A cooling arrangement for cooling of an apparatus which when used may generate heat, the cooling arrangement comprising:
   a first member comprising a first base and a first spiral wrap extending from the first base, the first member being configured to at least thermally couple the apparatus thereto;
   a second member comprising a second base and a second spiral wrap extending from the second base, the first spiral wrap and the second spiral wrap being interleaved;
   wherein at least one of the first member and the second member can be moved so as to result in an orbiting motion of one of the first spiral wrap and the second spiral wrap relatively to the other one of the first spiral wrap and the second spiral wrap such that a volume of fluid in at least one space between the first spiral wrap and the second spiral wrap progressively moves during the orbiting motion, thereby generating a flow of fluid between the first spiral wrap and the second spiral wrap, which flow of fluid cools the first member by means of dissipation of heat generated by the apparatus by way of transfer of heat from the first member to the flow of fluid between the first spiral wrap and the second spiral wrap, further comprising a heat spreader (26) coupled to the first member, wherein the first member is configured to couple the apparatus to the first member via the heat spreader.

2. A cooling arrangement according to claim 1, further comprising a drive unit configured to controllably move at least one of the first member and the second member so as to result in the orbiting motion.

3. A cooling arrangement according to claim 2, wherein the drive unit comprises at least one electromagnetic and/or electromechanical actuator configured to controllably generate forces which affect the at least one of the first member and the second member in order to controllably move the at least one of the first member and the second member so as to result in the orbiting motion, wherein the at least one electromagnetic and/or electromechanical actuator is a linear actuator.

4. An apparatus according to claim 3, wherein the at least one electromagnetic and/or electromechanical actuator is configured to controllably generate forces which affect the at least one of the first member and the second member in order to controllably move the at least one of the first member and the second member along at least two mutually perpendicular imaginary axes in respective oscillatory motions, resulting in the orbiting motion of one of the first spiral wrap and the second spiral wrap relatively to the other one of the first spiral wrap and the second spiral wrap.

5. A cooling arrangement according to claim 1, further comprising:
   a support structure, wherein at least a portion of the support structure is configured to resiliently support at least one of the first member and the second member in the cooling arrangement while permitting movement of the at least one of the first member and the second member resulting in the orbiting motion.

6. A cooling arrangement according to claim 5, wherein the at least one electromagnetic and/or electromechanical actuator is configured to controllably apply forces onto at least a portion of the support structure in order to controllably move the at least one of the first member and the second member so as to result in the orbiting motion, the movement of the at least one of the first member and the second member being effected by way of the resilient supporting of the at least one of the first member and the second member by the support structure.

7. A cooling arrangement according to claim 1, wherein the first member is configured to couple the apparatus thereto.

8. A cooling arrangement according to claim 7, wherein the first base comprises a first side and a second side, wherein the first spiral wrap extends from the first side, and wherein the first member is configured to couple the apparatus to the second side.

9. A cooling arrangement according to claim 1, wherein the first member is fixedly arranged and the second member is movable relatively to the first member so as to result in an orbiting motion of the second spiral wrap relatively to the first spiral wrap.

10. A cooling arrangement according to claim 9, wherein the first member and the second member are arranged such that the second spiral wrap can be driven to orbit eccentrically relatively to the first spiral wrap.

11. A cooling arrangement according to claim 1, wherein at least one of first spiral wrap and the second spiral wrap is arranged such that it is wrapped at most 1.5 revolutions about its origin.

12. A system comprising:
    an apparatus which when used may generate heat; and a cooling arrangement according to claim 1 for dissipating heat generated by the apparatus when it is used, the cooling arrangement being at least thermally coupled to the first member of the apparatus.

13. A system according to claim 12, wherein the apparatus comprises a light-emitting device configured to emit light when in use.

14. A system according to claim 13, wherein the light emitting device comprises a carrier substrate on which one or more light-emitting diodes are arranged.

* * * * *